US009285857B2

(12) United States Patent
Mahajan et al.

(10) Patent No.: US 9,285,857 B2
(45) Date of Patent: Mar. 15, 2016

(54) APPLICATION IDLE CURRENT DRAIN MEASUREMENT

(71) Applicant: Cellco Partnership, Arlington, VA (US)

(72) Inventors: Amit Mahajan, Bridgewater, NJ (US); Jacques Meekel, Hampton, NJ (US); Greselda P. Powell, Morristown, NJ (US); Krishna P. Iyer, Aurora, IL (US)

(73) Assignee: Cellco Partnership, Basking Ridge, NJ (US)

( * ) Notice: Subject to any disclaimer, the term of this patent is extended or adjusted under 35 U.S.C. 154(b) by 583 days.

(21) Appl. No.: 13/731,903

(22) Filed: Dec. 31, 2012

(65) Prior Publication Data

US 2014/0188412 A1     Jul. 3, 2014

(51) Int. Cl.
*G01R 31/36* (2006.01)
*G06F 1/32* (2006.01)

(52) U.S. Cl.
CPC .......... *G06F 1/3206* (2013.01); *G01R 31/3606* (2013.01); *G01R 31/3679* (2013.01)

(58) Field of Classification Search
CPC ..... H04L 12/66; H04L 67/306; H04W 4/001; H04W 24/02; H04W 28/0215; H04W 48/18; G06F 1/3206; G01R 31/3606; G01R 31/3679
USPC .............................. 702/63; 415/418; 370/235
See application file for complete search history.

(56) References Cited

U.S. PATENT DOCUMENTS

2012/0108225 A1\* 5/2012 Luna et al. .................... 455/418

\* cited by examiner

*Primary Examiner* — Toan Le
*Assistant Examiner* — Xiuquin Sun

(57) ABSTRACT

A device may identify an exhibited idle mode current draw according to test results representative of measured current usage associated with execution of an application under test on a test mobile device in communication with a live communications network of a network service provider; determine a battery consumption rating associated with the application under test according to the idle mode current draw and predetermined rating criteria; and update a listing of application ratings based on the determined battery consumption rating of the application under test.

20 Claims, 4 Drawing Sheets

APPLICATION IDLE CURRENT DRAIN MEASUREMENT

BACKGROUND

In typical use, a portable device may be powered by a battery having a fixed capacity. The current draw by the portable device from the battery may not be constant, however. Many modern devices implement power management schemes whereby components of the device that are not being used are moved to a lower power state to reduce device power consumption and increase battery life. As some examples, the portable device may reduce its power consumption by deactivating the screen when the screen is not being used, reducing the brightness of a backlight according to ambient lighting, turning off one or more processors when they are not in use and deactivating network components when network facilities are not required.

Battery life is an important consideration for battery-powered mobile devices. For example, many models of smartphone and tablet computer advertise estimated battery life information. However, a user may not necessarily observe the advertised battery life. This may be due to various factors, one of which being that applications installed on the device may make excessive use of device resources when the device is idle or not actively being used, negatively affecting the battery life. However, users may be unaware of the cause of the battery drain, and may become frustrated with their devices.

DETAILED DESCRIPTION

Figure 1:
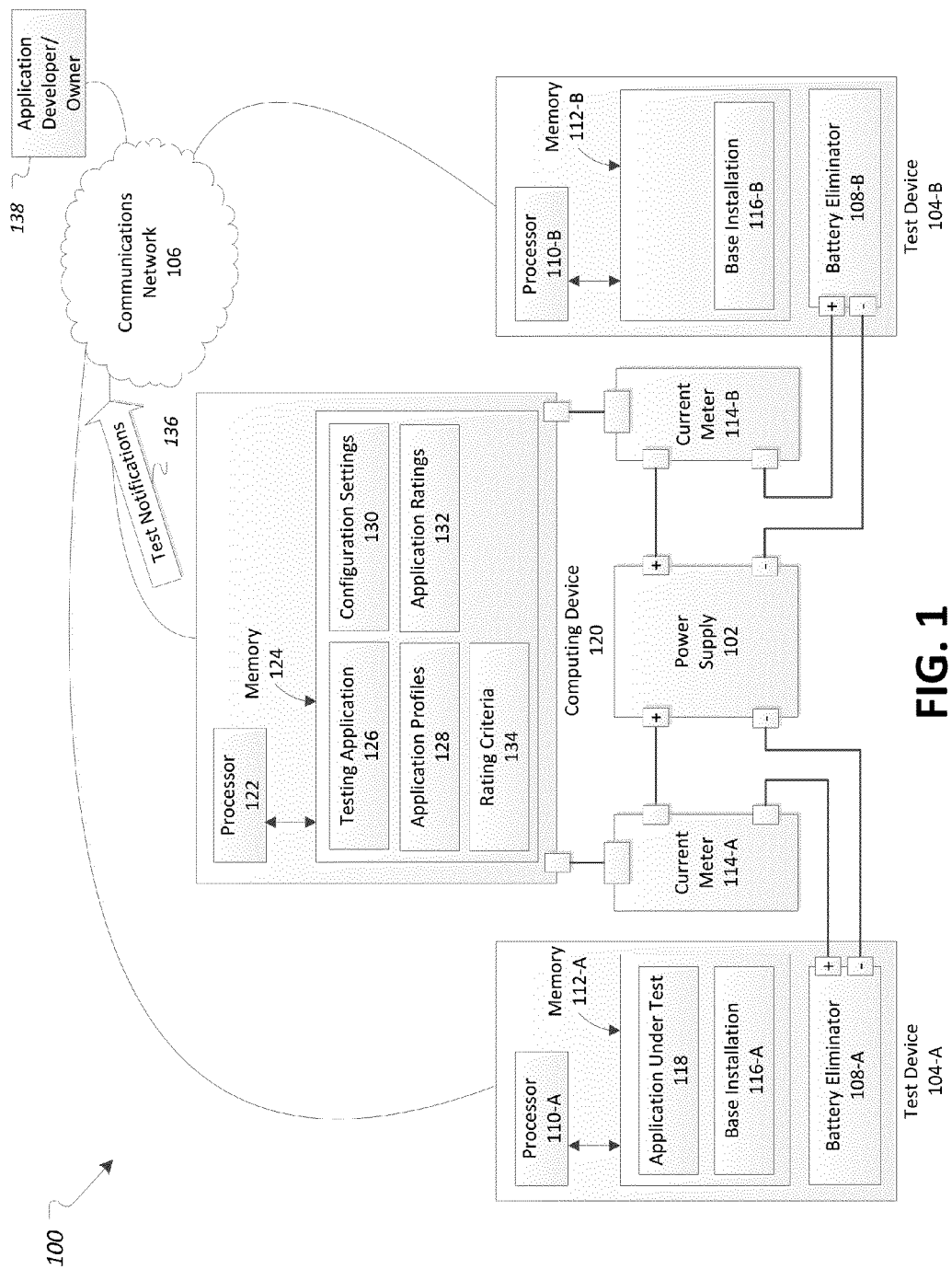
FIG. 1 illustrates an exemplary system for rating a current draw of an application under test.

When an application is being actively used, the application utilizes device resources such as the CPU or network features. A customer may expect such active use of the application to affect battery life. However, when an application is not being actively used, and the device is in an idle mode, the customer will not expect the application to cause additional battery drain, especially when the application is running in the background.

A service provider may maintain application development guidelines, requirements or both for applications that are installed on devices that may access network resources of the service provider. These guidelines and requirements may be for applications that come preinstalled as well as for applications installed by users, and may be for applications that use network resources or for applications that do not use network resources. The service provider may require that current drain of an application running in an idle mode on a user's network device shall not exceed a predetermined threshold amount of current drain, given conditions such as no user activity and default settings. The service provider may maintain and provide ratings of the current drain attributable to various tested applications when the device is in the idle mode (sometimes referred to herein as idle mode current drain). These application ratings may allow users to make informed decisions with respect to side effects of the installation of applications on the user's device. For preloaded applications, a user may be provided with an option to disable preinstalled applications that are determined to have relatively high application current drain.

To facilitate the application ratings, a test environment system may be configured to measure an idle mode current drain of an application under test. The application under test may be run by a test device, in comparison with another control device that does not have the application under test running Both devices may then be allowed to fall into a deep sleep or idle mode. Once in the idle mode, current usage measurements of the two devices may be taken and compiled. The measured difference in current drain between the two devices may provide an indication of us how much battery life the application under test uses when running in the foreground or background.

Using the identified current measurements and current drain rating criteria, the system may use rating criteria to rate the application under test in terms of battery consumption and thus on the impact of the application under test on device battery life. The system may maintain rating criteria customized for applications or types or categories of applications to facilitate the comparison of the idle mode current drain of an application with a threshold idle mode current drain applicable to the type, features, or category of the application under test. One exemplary metric may be that current drain for an application under test running with default settings in idle mode (e.g., where the application under test may be in the foreground or the background, but with no user activity) should not exceed an average current draw level indicative of a particular amount of loss of battery life. (In this context, an application being in the foreground may indicate that the application is a current target for receiving user input from a user of the test device. In some cases, an application may remain running on the test device but may not be the current target for user input or may even not be visible at all.) For instance, for an exemplary application executing on a device or for average for applications executing on devices generally, an application causing a device to have an idle mode current drain of 5 mA may be used as a threshold, correspond to approximately a 30-60 minute loss in battery life for such devices.

To ensure that the test is representative of default working of the application under test, the application may be profiled to understand aspects of its behavior. These aspects may then be used to adjust the timing, duration, active services and other configuration settings of the test and test devices. As another example, the application under test may be installed in a default device configuration or in a typical device configuration along with other popular applications to ensure no unintended side effects occur due to application interactions. Moreover, to ensure that the test environment is representative of network conditions, the current measurements may be taken while the devices are operating in a live environment (e.g., connected to the Verizon Wireless 4G LTE Network as an example). Using an actual communications network allows the test devices to be exposed to network conditions such as varying connection strength, real-time network updates, or other network conditions that may not be adequately simulated in a test lab environment. The test environment may be utilized by the service provider or in other cases by the application developer or owner. (The application developer may, for example, be a party that writes the application, while the owner may be the application developer or another party with ownership interest in the application). In some cases, the application developers may use the results of the current drain tests to improve the battery consumption of their applications and therefore reduce the application's battery consumption impact on overall battery life of the device.

Rather than testing every application, the system may automatically identify only certain applications that provide the most value to test within a predetermined period (e.g., once/week at a predetermined time). For example, the system may identify to test applications indicated as being the most used applications (e.g., top 25 free downloads, top 25 paid downloads, top 25 most used applications, etc.). Statistics on the top applications may be identified, for example, from statistics maintained by application download locations (e.g., the Google Play application store, the Apple iTunes App store, etc.). In some examples, preloaded applications that come installed on a test device may be included in the list of applications to be tested. In some cases, the system may prioritize applications to be tested in a particular ordering according to their placement in one or more of the aforementioned categories.

FIG. 1 illustrates an exemplary system 100 for rating a current draw of an application under test 118. The system may include a power supply 102 connected to test device 104-A using a battery eliminator 108-A and connected to a test device 104-B using a battery eliminator 108-B. The test device 104-A may include a processor 110-A that execute instructions stored on memory 112-A, such as those of a base installation 116-A of software as well as those of an application under test 118. The test device 104-B may include a processor 110-B that executes instructions stored on memory 112-B, including those of a base installation 116-B of software, but not the application under test 118. The system may further include a current meter 114-A in circuit with the test device 104-A and a current meter 114-B in circuit with the test device 104-B. The system may also include a computing device 120 in communication with the current meters 114-A and 114-B. The computing device 120 may include a processor 122 that executes instructions stored on memory 124, including those of a testing application 126. The memory 124 may also store application profiles 128, configuration settings 130, application ratings 132, rating criteria 134 and potentially test notifications 136 to be sent. The system 100 may take many different forms and includes multiple and/or alternate components and facilities. While an exemplary system 100 is shown in FIG. 1, the exemplary components illustrated of the system 100 are not intended to be limiting. Indeed, additional or alternative components and/or implementations may be used.

The power supply 102 may be configured to receive electrical energy from a source such as an A/C power line, and may provide controlled output voltages despite variations in current load or received power. As illustrated, the power supply 102 may be configured to supply power to the test device 104-A and to the test device 104-B.

The test devices 104-A and 104-B may be any of various model of networked devices, such as cellular phones, tablet computers, or other types of portable computing device capable of execution applications and being connected to a communications network 106 while powered by a battery. For purposes of the testing, however, the test devices 104-A and 104-B should be of the same model as one another.

The test devices 104-A and 104-B may be configured to communicate over a communications network 106. The communications network 106 may be configured to transport data between devices on the communications network 106. For instance, the communications network 106 may provide communications services, including packet-switched network services (e.g., Internet access, VoIP communication services) and circuit-switched network services (e.g., public switched telephone network (PSTN) services) to devices connected to the communications network 106. Exemplary communications networks 106 may include the PSTN, a VoIP network, a VoLTE (Voice over LTE) network, a cellular telephone network, a fiber optic network, and a cable television network. To facilitate communications, communications devices on the communications network 106 may be associated with unique device identifiers being used to indicate, reference, or selectively connect to the identified device on the communications network 106. Exemplary device identifiers may include telephone numbers, mobile device numbers (MDNs), common language location identifier (CLLI) codes, internet protocol (IP) addresses, input strings, and universal resource identifiers (URIs). Each test device 104 may be associated with one or more such device identifiers.

To facilitate the powering of the test devices 104-A and 104-B by the power supply 102, battery eliminators 108-A and 108-B may be placed in the battery slots of the test devices 104-A and 104-B, respectively. Rather than including battery cells, the battery eliminator 108 may instead provide terminals suitable for connection to a power source, such as the power supply 102. Sometimes referred to as a dummy battery, a battery eliminator 108 may be used instead of an actual battery to simulate a fully charged battery for the entire duration of the test period. Use of the battery eliminator 108 may thus to remove the variable of battery charge level from the test process.

A circuit may therefore be completed between the terminals of the battery eliminator 108 and the terminals of the power supply 102, where the positive terminal of the power supply 102 may be connected to the positive terminal of the battery eliminator 108 and the negative terminal of the power supply 102 may be connected to the negative terminal of the battery eliminator 108.

To measure the current flow to the test devices 104-A and 104-B, current meters 114-A and 114-B may further be wired into the circuits between the power supply 102 and the test devices 104. For example, a current meter 114-A may be wired between the positive terminal of the power supply 102 and the positive terminal of the battery eliminator 108-A, and a current meter 114-B may be wired between the positive terminal of the power supply 102 and the positive terminal of the battery eliminator 108-B. The current meters 114-A and 114-B may include low resistance shunt resisters (e.g., 0.001 ohm-0.1 ohm) in line with the respective circuit paths, and may further measure a voltage across the shunt resister. Based on the voltage and the formula $I=V/R$, the current meter 114 may identify a magnitude of the current flow. The current meter 114 may further make the current flow information available to various other devices by way of a communications interface, such as via a universal serial bus (USB) connection.

The base installations 116-A and 116-B of the test devices 104-A and 104-B, respectively, may include the initial software configuration of the devices as routinely purchased, including, for example, an operating system (e.g., Android, iOS, Windows Mobile, etc.) and any preinstalled applications. In some cases, the base installations 116-A and 116-B may also include additional commonly-installed applications, while in other cases the base installations 116-A and 116-B may remain the stock configurations. In some cases, the creation of the base installations 116 may include a process through which the service provider provides certain requirements to a manufacturer of the test device 104, e.g., applications that should or should not be installed on the test device 104 or settings that should be included. The base installations 116-A and 116-B may be substantially the same for purposes of the test, but the application under test 118 may be installed only on the test devices 104-A. There may, however, be certain small variations between the installations 116-A and 116-B, such as unique hardware identifiers specific to a particular device or SIM information that may differ from device to device.

The computing device 120 may be in communication with the current meters 114-A and 114-B, and may be configured to receive the current drain information over the communications interface with respect to the test devices 104-A and 104-B. The computing device 120 may be further configured to execute a testing application 126 configured to calculate a portion of battery consumption resulting from execution of the application under test 118. This may be done by comparing the relative current drain of the test devices 104-A and 104-B over a period of time to eliminate the common current drain due to execution of the base installations 116-A and 116-B. The computing device 120 may be further configured to determine an application rating 132 for the application under test 118 based on the determined current drain and compiled application ratings 132 for a plurality of applications under test 118. Exemplary application ratings 132 may include a good/bad indication, or a score from 1 to 5 indicative of relative battery consumption or battery life reduction, as some examples. These compiled application ratings 132 may then be provided to users of the communications network 106 to allow them to determine what applications may be causing them battery life issues.

The application profiles 128 may include information about the application under test 118 that may be used to facilitate the capture of realistic application current drain measurements by the computing device 120. As a starting point, an application profile 128 for an application under test 118 may include a set of default settings, such as factory-default settings for a test device 104 and a default test duration and time. These settings may include screen brightness settings and enabled/disabled services, as some examples. However, these default settings may require adjustment based on an identification of aspects of the default workings of the application under test 118.

To ensure the proper execution of the application under test 118, the application profile 128 for the application under test 118 may be updated in accordance with an identification of additional processes or services that are associated with the application under test 118. The application profile 128 may also be updated in accordance with information indicative of whether the application under test 118 can run in a background, or whether attempting to put the application under test 118 in the background deactivates background processes of the application under test 118 or causes the application under test 118 to exit. The application profile 128 may also be updated in accordance with an identification of when whether the application under test 118 prevents the test device 104-A from entering sleep mode when the application under test 118 is invoked and in idle mode.

To ensure that server synchronizations do not adversely affect the test, the application profile 128 may also be updated in accordance with information indicative of whether any default scheduled server synchronizations are intended to occur when the application under test 118 is in foreground or in the background. If such synchronizations occur, the application profile 128 may also be updated in accordance with an identified frequency of the synchronizations and what time of the day the synchronizations occur. The application profile 128 may also be updated in accordance with information indicative of whether the application under test 118 requires use of external accounts (e.g., a G-mail account, a device backup account, etc.) or location services to operate.

The application profile 128 may also be updated in accordance with information indicative of how a user may exit out of the application under test 118. For instance, the application profile 128 may be required to specify different actions to move the application under test 118 into the background or to exit out of the application under test 118. The application profile 128 may also include information regarding what occurs when a user exits out of the application under test 118. For example, application profile 128 may include information with respect to whether exiting out of the application under test 118 means that processes or services associated with the application under test 118 have stopped running.

To ensure that a test is not affected by an application upgrade cycle, the application profile 128 may also be updated in accordance with information indicative of how the application under test 118 may be updated. For example, the application profile 128 may identify whether an upgrade of the application under test 118 may be performed as a force upgrade when a newer version of the application under test 118 is available, and in some cases how often the application under test 118 may be updated.

As a specific example of an application profile 128 adjusted based on these factors, the test duration of an application profile 128 may be set to twenty-four (24) hours because the scheduled daily scan may be randomly initiated between 1:00 AM and 5:00 AM, and the scheduled daily update may be randomly initiated between 12:00 AM and 6:00 PM. Hence, a twenty-four hour run would satisfy the scheduled scan and update tasks of the application under test 118.

The configuration settings 130 may include configuration requirements of the test devices 104 to facilitate the proper testing of the application under test 118. In some cases, the configuration settings 130 may be associated with a type of test device 104. Default configuration settings 130 may include, for example, assigning factory default/out-of-box settings to the test devices 104-A and 104-B prior to initiating a test of the application under test 118.

To ensure appropriate lighting conditions for the test, the configuration settings 130 may include lighting requirements. For instance, the lighting requirements may indicate for the test devices 104-A and 104-B to be placed under standard office lighting prior to testing. Or, the lighting requirements may indicate for the test devices 104-A and 104-B to be placed in dark conditions as another example. The configuration settings 130 may be altered, for example, according to an application profile 128 for the application under test 118 indicating that the application under test 118 is designed for use at nighttime or during other low-light conditions.

To ensure proper network conditions for the test, the configuration settings 130 may include network requirements. For example, the network requirements may include that test is to be conducted under live network coverage over the communications network 106. For instance, for taking measurements, the configuration settings 130 may include that the test devices 104 are in a 4G coverage area and the test devices 104 are not be forced to a particular network technology. As another possibility, the configuration settings 130 may include that test devices 104 operating in LTE mode shall be tested at a particular level of network strength (e.g., with a power indicator at four bars from a range from 1 to 5 bars, or in network conditions that represent network conditions under which many or most of the network customers reside). It may be beneficial for a test not to be executed in a low signal strength environment to isolate the current drain and thus the battery consumption coming from execution of the application under test 118 from network-related sources of battery drain such as network retries.

To ensure proper functioning of the test devices 104, the configuration settings 130 may also include power supply 102 settings. For example, the voltage of the power supply 102 may be set to a device manufacturer recommended voltage setting for the test devices 104.

As another way to ensure the reliability of the test results, the configuration settings 130 may specify a network service provider production subscriber identity module (SIM) to be used for tests including 4G-enabled test devices 104.

The application ratings 132 may include ratings of applications under test 118 according to battery consumption. The application rating 132 may include further details of the application under test 118, such as a title of the applications under test 118, a developer of the application under test 118, an owner of the application under test 118, a contact address for receiving correspondence related to the application under test 118, a version number of the applications under test 118, a description of the application under test 118, a comment about the application under test 118, and a date or time at which the most recent review of the application under test 118 was performed.

The rating criteria 134 may include criteria to facilitate comparison of an idle mode current drain of an application under test 118 with a threshold idle mode current drain applicable to the application under test 118. For example, the rating criteria 134 may include an overall threshold level of idle mode current drain that the application under test 118 should not exceed. One exemplary metric may be that current drain for an application under test running with default settings in idle mode should not exceed an average current draw of 5 milliamps (mA).

In some cases, the rating criteria 134 may include current thresholds that are tuned according to the type, features, or category of application under test 118. For example, the rating criteria 134 may include a threshold level of idle mode current drain for an instant messaging application or other network type application that may be higher than a threshold level of idle mode current drain for another type of application, such as for a local address book application or game. To establish reasonable thresholds for what is typical for a type, category, or feature of an application, information with respect to the idle mode current usage of previously tested applications may be maintained in the memory 124 of the computing device 120. As an example, an idle mode current drain threshold for instant messaging applications may be established as an average of the idle mode current drains of previously tested instant messaging communications applications, or as an average of the idle mode current drains of previously tested instant messaging communications applications that meet an overall threshold level of idle mode current drain that applications should not exceed.

The rating criteria 134 may further include multiple threshold levels against which the idle mode current drain of the application under test 118 may be compared. For instance, rating criteria 134 may include multiple ranges of current draw such that if the current draw of the application under test 118 is within a range, the application under test 118 may be assigned a battery consumption application rating 132 associated with a current draw being in that respective range. For instance, an application rating 132 of five may be assigned to an application under test 118 having a current drain less than or equal to 5 mA (corresponding to approximately 30 minutes of battery life loss for an exemplary test device 104 when the test device 104 is idle); an application rating 132 of four for a current drain greater than 5 mA and less than or equal to 10 mA (corresponding to approximately 30-60 minutes of battery life loss); an application rating 132 of three for a current drain greater than 10 mA and but less than or equal to 15 mA (corresponding to approximately 60-90 minutes of battery life loss); an application rating 132 of two for a current drain greater than 15 mA and but less than or equal to 20 mA (corresponding to approximately 90-120 minutes of battery life loss); and an application rating 132 of one for any current drain greater than 20 mA (corresponding to greater than 120 minutes of battery life lost).

It should be noted that these rating criteria ranges and exemplary battery life loss figures are merely exemplary and vary according to factors such as type of test device 104 and battery rating type. For example, the mA idle mode current draw threshold may be defined according to an amount of device idle mode current drain identified as causing a particular amount of loss of battery life. To identify the idle mode current drain threshold value, the system may analyze data from tests of idle mode current drains across different test devices 104, base configurations 116, operating systems, battery types and battery rating (capacity) types. It may be noted that the same application under test 118 may reduce battery life more on one test device 104 than on another, or that the reduction in battery life may vary according to other applications running in foreground and background. Nevertheless, based on collected sample data, the system may identify an amount of current drain that would cause a particular amount of reduction in battery life. For example, based on various tests, different devices, battery types and battery rating types may be sorted in terms of battery life, and a representative test device 104 or representative test devices 104 may be identified by selecting devices from a middle of the range of the sorted test data. Based on these representative test devices 104, a reduction in battery life of a particular amount of time may be translated into an idle mode current drain that may be tested for by the system 100. As a more specific example, an milliamp current draw threshold may be determined that may cause approximately 30-60 minutes of reduced battery life on the test device 104. The threshold time amount of 30-60 minutes is merely exemplary, but current drain when in the idle mode sufficient to cause a 30-60 minute reduction in battery life may be a useful metric due to being a significant enough amount of battery life loss for a user to notice. For certain exemplary applications, the exemplary 5 mA of idle mode current drain discussed above may correspond to the approximately 30-60 minutes of reduced battery life.

In some cases, the rating criteria 134 may further include criteria indicative of an application that may be relatively high-risk for a user to install. As an illustrative example, a high-risk application may be one causing a battery drain of two to three times the normal rate for a test device 104. Such an effect may be caused by the high-risk application preventing the test device 104 from entering a sleep or a deep sleep or other low power mode. If such a high-risk application is encountered, the rating criteria 134 may specify certain additional information that may be included in the application rating 132 for the high risk application. For instance, the additional information may include descriptive text such as "When running, this app keeps the device from going to sleep mode. As a result, a device left untouched with the app running will drain the battery about 2.5 times faster than normal."

The test notifications 136 may include various types of indications that may be generated based on the determination of an application rating 132 for an application under test 118. Test notifications 136 may this serve to alert interested parties to the application rating 132 process with respect to the determined results. Test notifications 136 may be sent from the computing device 120 to application developers or owners 138 by way of the communications network 106.

For instance, the sending of the test notifications 136 may be triggered upon completion of a test of the application under test 118. A test notification 136 may be sent to a developer/owner 138 of the application under test 118 to inform the application developer/owner 138 that there may be an issue with the idle mode battery consumption of the application under test 118. The test notification 136 may include content such as one or more of: an application rating 132 determined for the application under test 118, an application profile 128 utilized during the test, rating criteria 134 utilized to determine the application rating 132, configuration information utilized to perform the test, and test data collected to determine the application rating 132. The test notification 136 may be addressed to the developer/owner 138 by way of stored data associated with the application rating 132, such as an associated developer, owner, or other contact information.

Thus, the test notification 136 may serve to notify the developer/owner 138 of the status of the application under test 118 as well as in some cases to provide the developer/owner 138 with information useful in diagnosing and correcting issues with the idle mode battery consumption of the application under test 118.

In some cases, the developer/owner 138 may address the issues identified by the test notification 136, and may provide a revised version of the application under test 118 to be tested again by the computing device 120. In some cases, the developer/owner 138 may further include a reason with the resubmission indicative of how the idle mode battery consumption issue was resolved. These reasons may be stored in the memory 124 of the computing device 120. The reasons may be selectively included as information in test notifications 136 sent for other applications under test 118 for which idle mode high current drain issues are identified. For example, if the computing device 120 receives a reason indicative of how an idle mode battery consumption issue was resolved for an instant messaging type application, that reason could be included in a test notification 136 sent with respect to a later tested instant messaging application having a similar idle mode current utilization issue. An issue may be determined as potentially being similar for various reasons, such as the issue being for a similar type of application, or the issue appearing similar to aspects of test data received from the test devices 104-A and 104-B of another application for which a resolution reason was received.

Figure 2:
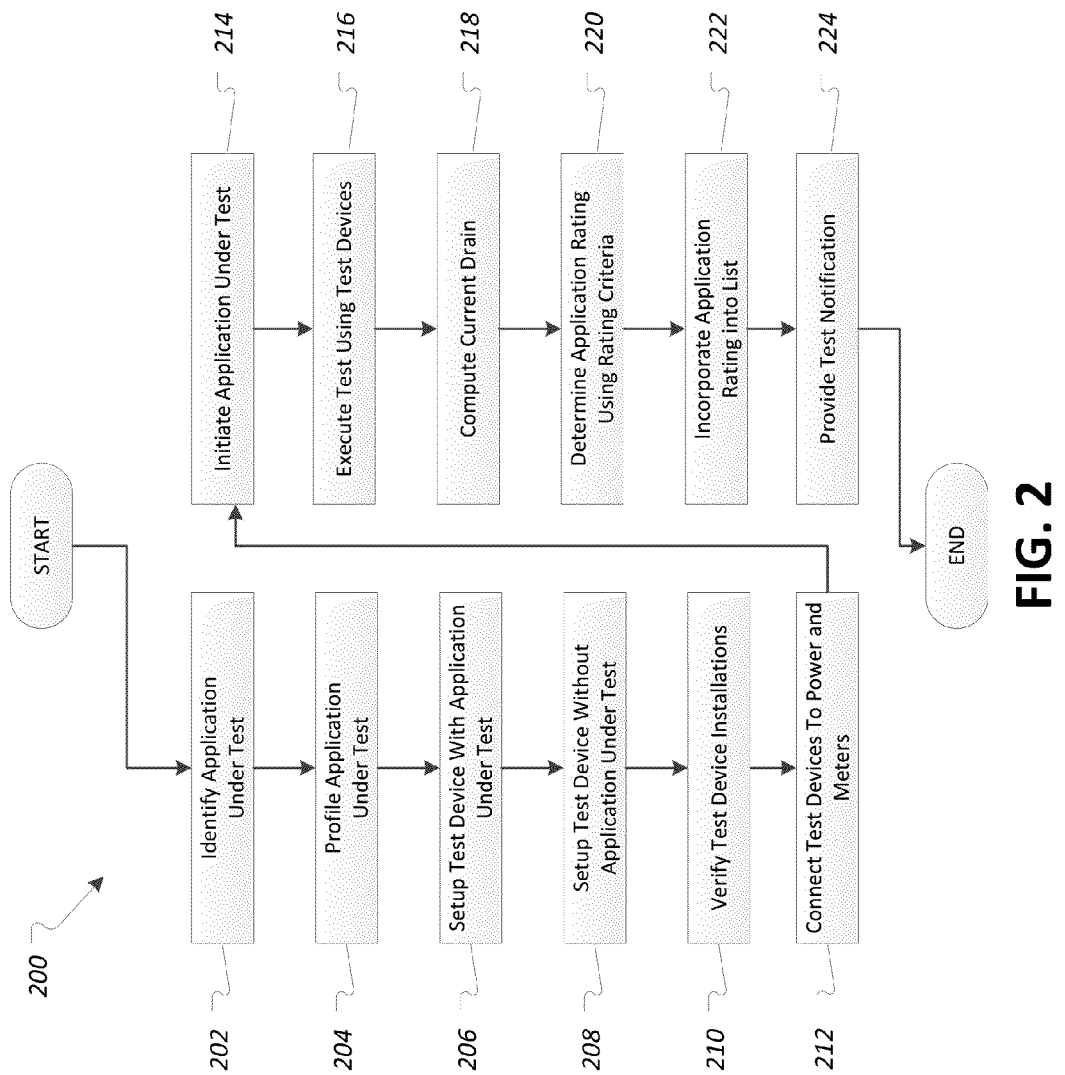
FIG. 2 illustrates an exemplary process for provisioning application ratings for applications under test.

FIG. 2 illustrates an exemplary process 200 for provisioning application ratings 132 for applications under test 118. In some cases the process 200 may be performed by a network service provider, while in other cases the process 200 may be performed in part by an owner, developer or vendor of the application under test 118.

In block 202, the system 100 identifies the application under test 118. The application under test 118 may be identified according to criteria used to determine applications most helpful to be tested. As an example, the criteria for selecting the application under test 118 may include preference to applications that are preloaded onto test devices 104, e.g., OEM-specific applications, applications installed in accordance with a service level agreement of the network service provider, applications sponsored by the network service provider, applications requested as being preloaded onto devices by the network service provider, and network service provided-branded versions of applications. As another example, the criteria for selecting the application under test 118 may include the exclusion of applications that are rarely installed on the test devices 104. As yet another example, the criteria for selecting the application under test 118 may include selecting a most used application (e.g., top 25 free downloads, top 25 paid downloads, top 25 used applications, etc.), or a most used, top or previously rated application for which a new version was recently released.

In block 204, the system profiles the application under test 118. The system may determine an application profile 128 including information about the application under test 118 that may be used to facilitate the capture of realistic application current drain measurements by the computing device 120. For example, the application profile 128 may include information with respect to background processes of the application under test 118, scheduled server synchronizations performed by the application under test 118, use of external accounts required by the application under test 118, or whether the application under test 118 can be put in the background.

In block 206, the system sets up the test device 104-A on which the application under test 118 will be installed. For example, the setup may include a factory data wipe of the test device 104-A and the installation of a base installation 116-A onto the test device 104-A. The setup may further include the disabling of services unnecessary to the test or other settings updates according to the application profiles 128 or configuration settings 130. For instance, the setup may include as disabling of location services and Google services for applications under test 118 whose application profiles 128 indicate that such services are not required. For applications that are not preloaded, the setup may also include the installation of the application under test 118 on the test device 104-A. For example, if an Android application package file is available for the application under test 118, then the application under test 118 may be installed using the "ADB" utility. As another example, a g-mail account of the user may be used to install the application under test 118. The system may further configure the test device 104-A according to an application profile 128 for the application under test 118. For example, if the application profile 128 for the application under test 118 requires a Google account, then the test devices 104-A may be set up to have a Google account. Or, Google automatic synchronizations may be turned off if they are not required by the application profile 128.

In some examples, the system may also install one or more other popular applications on the test device 104-A along with the application under test 118. This may be done, for instance, to allow for the testing of situations in which an application under test 118 and another application may interact together in a matter where the application under test 118 draws more current than when installed individually in a clean environment. For example, other popular applications indicated as being the most used applications (e.g., top 25 free downloads, top 25 paid downloads, top 25 most used applications, etc.) may be installed along with the application under test 118.

In block 208, the system sets up the test device 104-B on which the application under test 118 will not be installed. As with the test device 104-A, the setup may include a factory data wipe of the test device 104-B, and the installation of the same base installation 116 onto the test device 104-B as done on the test device 104-A. The setup may further include the disabling of services unnecessary to the test on the test device 104-B to ensure that both test device 104-A and test device 104-B share the same hardware and software configuration, apart from the fact that the application under test 118 is not installed on the test device 104-B. Aspects of the device setup performed in block 206 and 208 may be performed by the testing application 126 executed by a computing device 120 connected to and in communication with the test devices 104-A and 104-B. However, it should be noted that any such connection, such as a connection via a USB cable, should be removed before a test is run to avoid affecting the test results.

In block 210, the system verifies the proper functioning of the test devices 104-A and 104-B. For example, the setup may ensure that one or more of test data and test voice communications may be possible to be sent and received using the test devices 104-A and 104-B. In some cases, the installation may include verification that the application under test 118 is installed properly on the test device 104-A. For example, an indication of the application under test 118 may be verified as being located in an application menu of the test device 104-A.

In block 212, the system connects the test devices 104-A and 104-B for testing. For example, the power supply 102 may be set to provide an output voltage as specified by a manufacturer of the test devices 104. The test devices 104-A and 104-B may further be connected to the power supply 102 and current meters 114-A and 114-B by way of the battery eliminators 108-A and 108-B, respectively. Once connected, the test devices 104-A and 104-B may further be powered on.

In block 214, the system initiates the application under test 118. As some examples, on the test device 104-A, the application under test 118 may be selected or executed or set to be the application in foreground or to be running in the background (if the application under test 118 can run in the background). On the test device 104-B, because the application under test 118 is not installed, the home screen or other default may be set as the currently active application. Further, the system may verify that the test devices 104-A and 104-B have entered an idle mode. An idle mode of a test devices 104 may be the state where the test device 104 enters standby mode, with background tasks that are part of factory settings only and with application default network or non-network behavior. Entrance into the idle mode may be verified or confirmed by monitoring the current draw using the current meters 114-A and 114-B. In some cases, verification of entrance into the idle mode may be confirmed by identifying a test device 104 maintaining a relatively low level of current draw for a predetermined period of time (e.g., a wait of approximately 10-20 minutes) before initiating the test. Moreover, the base current may be verified as being within an expected normal range for the base installation 116 of the test devices 104. In some cases, a predetermined amount of time after an idle mode is verified may be waited to allow for device activity to quiet down before taking the measurements.

In block 216, the system executes the current drain test of the test devices 104-A and 104-B. Preferably the current drain test would be executed with the test device 104-A in a low power sleep mode, but applications under test 118 may prevent the device entering certain low power sleep modes. For example, the system may perform current draw measurements on the test devices 104-A and 104-B by way of the current meters 114-A and 114-B. More specifically, current measurement may be started on the test devices 104-A and 104-B substantially simultaneously and at a time as specified by the application profile 128 associated with the application under test 118. The current measurement may be performed according to the current meters 114-A and 114-B, and may be maintained for a duration specified by the application profile 128. Upon completion of the test period, logging of current measurement for the test devices 104-A and 104-B may be concluded in a substantially simultaneous manner.

In block 218, the computing device 120 computes an idle mode current drain associated with execution of the application under test 118. For example, the computing device 120 may execute a testing application 126 configured to compute, based on the current measurements of the test devices 104-A and 104-B, a delta between the current drawn by the test devices 104-A and that drawn by the test device 104-B. This idle mode current draw delta is identified as being the additional current drawn by idle mode execution of the application under test 118.

In block 220, the computing device 120 determines an application rating 132 for the application under test based on the average idle mode current draw and rating criteria 134. As an example, the application rating 132 may include a simple good/bad indication according to rating criteria 134 identifying whether the idle mode current draw delta exceeds a predetermined threshold value.

As another example, the computing device 120 may compare the idle mode current draw delta to rating criteria 134. The rating criteria 134 may include various types of criteria, such as an overall threshold level of idle mode current drain that the application under test 118 should not exceed, current thresholds that are tuned according to the type, features, or category of application under test 118, or multiple threshold levels against which the idle mode current drain of the application under test 118 may be compared, as some examples.

In block 222, the system 100 incorporates the application rating 132 for the application under test 118 into a listing of application ratings 132. For example, the application rating 132 for the application under test 118 may be added to a listing of application ratings 132 for other tested applications. As another example, the application rating 132 for the application under test 118 may replace a previous application rating 132 for the application under test 118, such as a rating for an earlier version of the application under test 118.

In block 224, the system 100 optionally provides test notifications 136. For example, the computing device 120 may send a test notification 136 to an owner, developer, or contact address for the application under test 118 regardless of the outcome of the test. In other cases the computing device 120 may send a test notification 136 in cases in which the application under test 118 performs poorly according to the rating criteria 134. The test notification 136 may inform the developer or owner that there may be an issue with the idle mode battery consumption of the application under test 118, and may include content such as one or more of: the application rating 132 determined for the application under test 118, the rating criteria 134 utilized to determine the application rating 132, the application profile 128 used to test the application under test 118, configuration or test data utilized to determine the application rating 132, and resolution reason information as discussed above. After block 224, the process 200 ends.

Figure 3:
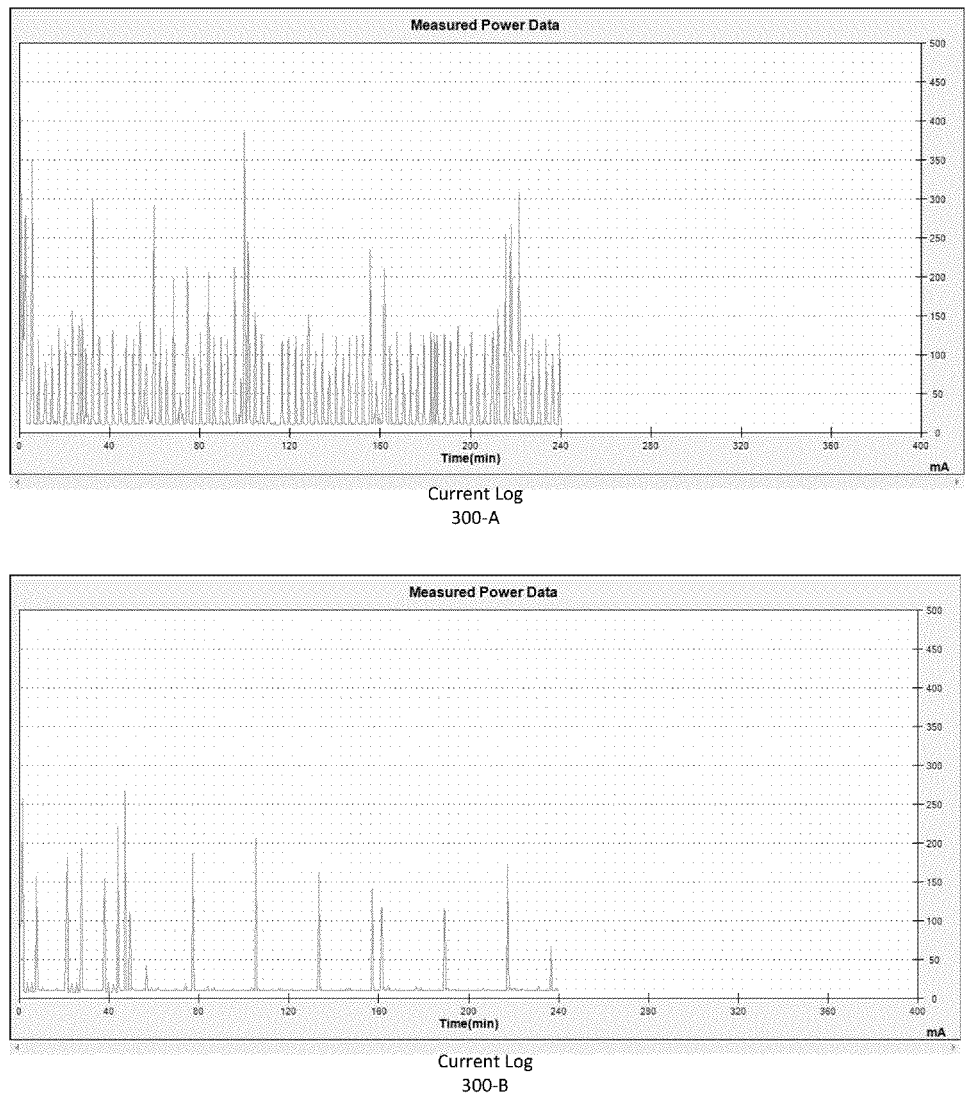
FIG. 3 illustrates an exemplary graphical representation of measured current usage data.

FIG. 3 illustrates an exemplary graphical representation of measured current usage data. For example, a current log 300-A may correspond to measured current usage of a test device 104-A executing an application under test 118, while the current log 300-B may correspond to measured current usage of a test device 104-B not executing the application under test 118. As illustrated, the current log 300-A shows additional current drain not found in the current log 300-B. This additional current drain may be caused by various factors, some examples including application timers that periodically use power-consuming aspects of the test device 104-A, and unnecessary data transfers or keep-alive network messages. These and other types of additional current drain that may accordingly be computed and rated to determine application ratings 132 indicative of battery life reductions resulting from idle mode execution of the applications under test 118.

The current log 300-A and 300-B information as illustrated in the current logs 300-A and 300-B may be used to identify high current drain patterns over time. For example, the current log 300-A may include periodic current draw peaks every five seconds, which may be used to locate application code including unnecessary usage of a five second timer by the application under test 118. As another example, a current log 300-A may include information indicative of the test device 104-A being unable to transition into a deep sleep or other low power mode. Thus, by way of analysis of the current log 300-A and 300-B information, the current drains of the test devices 104-A and 104-B can be utilized to diagnose and fix current drain issues with the application under test 118.

Figure 4:
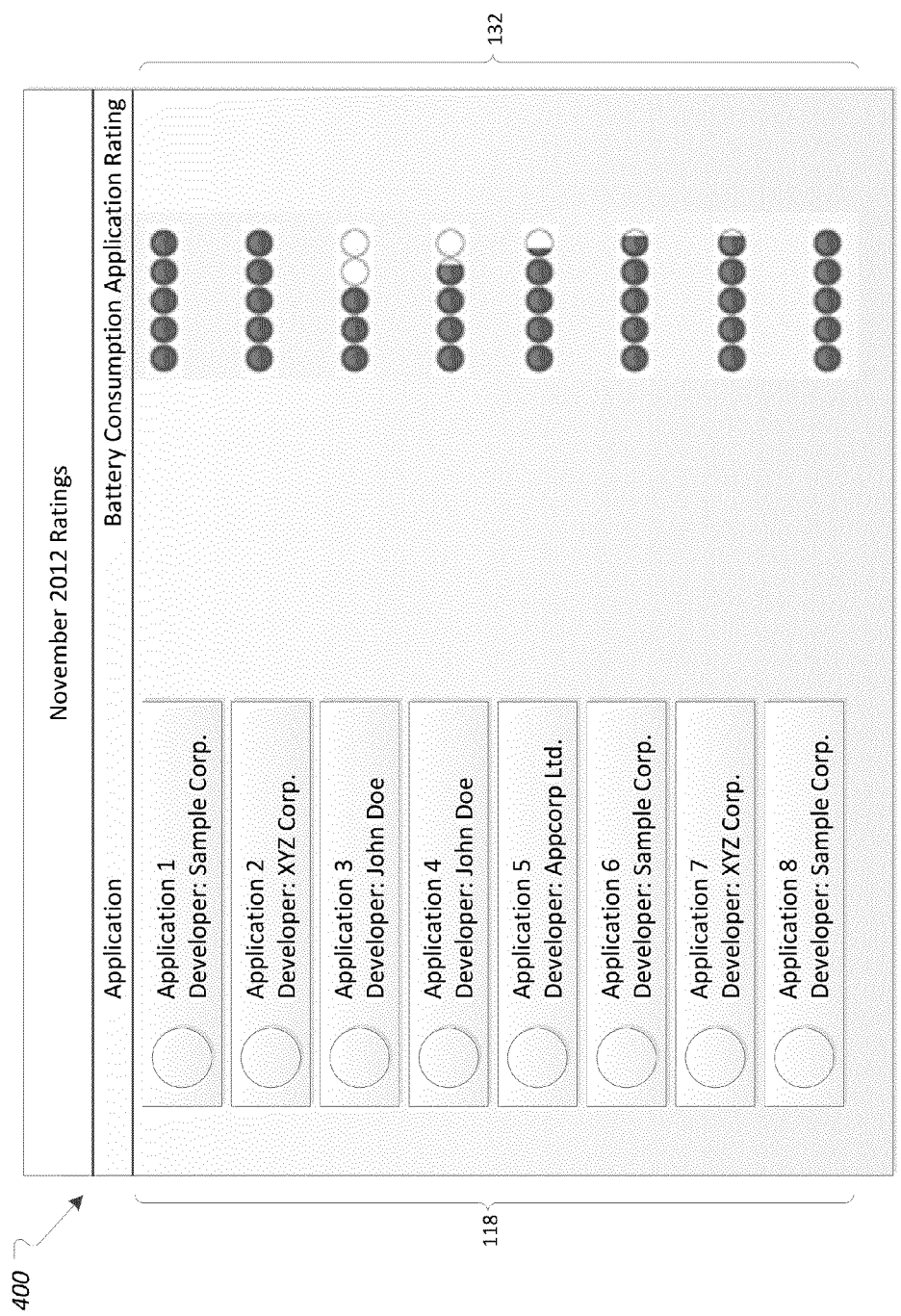
FIG. 4 illustrates an exemplary listing of application ratings associated with applications under test.

FIG. 4 illustrates an exemplary listing 400 of application ratings 132 associated with applications under test 118. For example, the listing 400 includes eight applications, each with an indicated battery consumption application rating 132. Based on the listed application ratings 132, a user may be able to identify which applications are likely to cause issues with battery life. For example, the "Application 3" can be seen to cause a relatively larger reduction in battery life as compared to other applications such as "Application 1" and "Application 8" which are rated relatively higher.

Thus, by using the exemplary system 100 for rating a current draw of an application under test 118, a service provider may maintain and provide application ratings 132 of the idle mode current drain of various applications under test 118. These application ratings 132 may allow users to make informed decisions with respect to side effects of the installation of applications on the user's devices. Moreover, through use of test notifications 136 generated according to the rating of applications under test 118, developers or owners of the applications under test 118 may receive information that may be used to identify and correct issues with excessive idle mode current drain of their applications.

Variations on the exemplary system 100 are possible. For example, in an alternate system 100, the idle mode current measurements may be performed by a first computing device 120 configured to provide the measurements to a second computing device 120 that performs the rating. Such an alternate system may allow for an application developer or owner to perform its own testing of an application under test 118 that may then be rated by the service provider. Accordingly, the alternate system 100 may allow for a developer to repeatedly test an application to ensure compliance with network service provider requirements before making the application available for use.

In general, computing systems and/or devices, such as the test devices 104 and the computing device 120, may employ any of a number of computer operating systems, including, but by no means limited to, versions and/or varieties of the Microsoft Windows® operating system, the Unix operating system (e.g., the Solaris® operating system distributed by Oracle Corporation of Redwood Shores, Calif.), the AIX UNIX operating system distributed by International Business Machines of Armonk, N.Y., the Linux operating system, the Mac OS X and iOS operating systems distributed by Apple Inc. of Cupertino, Calif., the BlackBerry OS distributed by Research In Motion of Waterloo, Canada, and the Android operating system developed by the Open Handset Alliance.

Computing devices such as the test devices 104 and the computing device 120 generally include computer-executable instructions such as the instructions of the application under test 118 or testing application 126, where the instructions may be executable by one or more processors. Computer-executable instructions may be compiled or interpreted from computer programs created using a variety of programming languages and/or technologies, including, without limitation, and either alone or in combination, Java™, C, C++, Visual Basic, Java Script, Perl, etc. In general, a processor or microprocessor receives instructions, e.g., from a memory, a computer-readable medium, etc., and executes these instructions, thereby performing one or more processes, including one or more of the processes described herein. Such instructions and other data may be stored and transmitted using a variety of computer-readable media.

A computer-readable medium (also referred to as a processor-readable medium) includes any non-transitory (e.g., tangible) medium that participates in providing data (e.g., instructions) that may be read by a computer (e.g., by a processor of a computing device). Such a medium may take many forms, including, but not limited to, non-volatile media and volatile media. Non-volatile media may include, for example, optical or magnetic disks and other persistent memory. Volatile media may include, for example, dynamic random access memory (DRAM), which typically constitutes a main memory. Such instructions may be transmitted by one or more transmission media, including coaxial cables, copper wire and fiber optics, including the wires that comprise a system bus coupled to a processor of a computer. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, an EPROM, a FLASH-EEPROM, any other memory chip or cartridge, or any other medium from which a computer can read.

Databases, data repositories or other data stores described herein may include various kinds of mechanisms for storing, accessing, and retrieving various kinds of data, including a hierarchical database, a set of files in a file system, an application database in a proprietary format, a relational database management system (RDBMS), etc. Each such data store is generally included within a computing device employing a computer operating system such as one of those mentioned above, and are accessed via a network in any one or more of a variety of manners. A file system may be accessible from a computer operating system, and may include files stored in various formats. An RDBMS generally employs the Structured Query Language (SQL) in addition to a language for creating, storing, editing, and executing stored procedures, such as the PL/SQL language mentioned above.

In some examples, system elements may be implemented as computer-readable instructions (e.g., software) on one or more computing devices (e.g., servers, personal computers, etc.), stored on computer readable media associated therewith (e.g., disks, memories, etc.). A computer program product may comprise such instructions stored on computer readable media for carrying out the functions described herein. The application under test 118 or testing application 126 may be one such computer program product. In some example, the application under test 118 or testing application 126 may be provided as software that when executed by the processor provides the operations described herein. Alternatively, the application under test 118 or testing application 126 may be provided as hardware or firmware, or combinations of software, hardware and/or firmware.

With regard to the processes, systems, methods, heuristics, etc. described herein, it should be understood that, although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating certain embodiments, and should in no way be construed so as to limit the claims.

Accordingly, it is to be understood that the above description is intended to be illustrative and not restrictive. Many embodiments and applications other than the examples provided would be apparent upon reading the above description. The scope should be determined, not with reference to the above description, but should instead be determined with reference to the appended claims, along with the full scope of equivalents to which such claims are entitled. It is anticipated and intended that future developments will occur in the technologies discussed herein, and that the disclosed systems and methods will be incorporated into such future embodiments. In sum, it should be understood that the application is capable of modification and variation.

All terms used in the claims are intended to be given their broadest reasonable constructions and their ordinary meanings as understood by those knowledgeable in the technologies described herein unless an explicit indication to the contrary in made herein. In particular, use of the singular articles such as "a," "the," "said," etc. should be read to recite one or more of the indicated elements unless a claim recites an explicit limitation to the contrary.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. A computing device storing a testing application, the testing application being executable by a processor of the computing device to provide operations comprising:
   identifying, by the processor, an idle mode current draw according to test results representative of measured idle mode current usage associated with execution of an application under test on a test mobile device in communication with a live communications network of a network service provider;
   identifying first information indicative of current usage of a first test mobile device onto which a base installation and the application under test are installed;
   identifying second information indicative of current usage of a second test mobile device onto which the base installation is installed but not the application under test;
   determining, by the processor, the idle mode current draw associated with execution of the application under test according to the first and second information; and
   determining, by the processor, a battery consumption application rating associated with the application under test according to the idle mode current draw and predetermined rating criteria, thereby allowing for improved battery consumption;
   wherein a listing of application ratings is updated based on the determined battery consumption application rating of the application under test.

2. The computing device of claim 1, wherein the testing application is further configured to cause the computing device to provide operations comprising sending a test notification including the application rating to at least one of an application developer of the application under test and an application owner of the application under test.

3. The computing device of claim 1, wherein the testing application is further configured to cause the computing device to provide operations comprising:
   identifying at least one type or category of the application under test; and
   selecting the predetermined rating criteria based at least in part on the identification.

4. The computing device of claim 1, wherein the testing application is further configured to cause the computing device to provide operations comprising at least one of:
   receiving the test results for the application under test from a developer of the application under test,
   receiving the test results for the application under test from an owner of the application under test, and
   determining the test results for the application under test by the service provider providing the listing of application ratings.

5. The computing device of claim 1, wherein the testing application is further configured to set a configuration of the first test mobile device and a configuration of the second test mobile device according to at least one of an application profile associated with the application under test and configuration settings associated with a type of the first and second test mobile devices.

6. The computing device of claim 1, wherein the predetermined rating criteria include a first battery consumption rating associated with a first range of current usage indicative of a first level of battery life loss associated with execution of the application under test and a second battery consumption rating associated with a second range of current usage indicative of a second level of battery life loss associated with execution of the application under test, wherein the testing application is further configured to cause the computing device to provide operations comprising at least one of:
   assigning the first battery consumption rating to the application under test when the idle mode current draw associated with execution of the application under test is included within the first range of current usage, and
   assigning the second battery consumption rating to the application under test when the idle mode current draw associated with execution of the application under test is included within the second range of current usage.

7. The computing device of claim 1, wherein the testing application is further configured to cause the computing device to provide operations comprising:
   identifying the application under test as being higher priority for being tested according to criteria including at least one of: (i) the application under test being a most frequently downloaded application, (ii) the application under test being a most frequently used application, (iii) the application under test being a popular application for which a new version is available, (iv) the application under test being preloaded on the testing device and (v) a previous version of the application under test being included in the listing of application ratings; and
   selectively including the application under test for testing in a listing of applications to be tested according to the identification of being higher priority.

8. A method, comprising:
identifying, by a computing device executing a testing application, an idle mode current draw according to test results representative of measured current usage associated with execution of an application under test on a test mobile device in communication with a live communications network of a network service provider;
identifying first information indicative of current usage of a first test mobile device onto which the application under test is installed;
identifying second information indicative of current usage of a second test mobile device onto which the application under test is not installed;
determining, by the computing device, the idle mode current draw associated with execution of the application under test according to the first and second information;
determining, by the computing device, a battery consumption rating associated with the application under test according to the idle mode current draw and predetermined rating criteria, thereby allowing for improved battery consumption; and
updating a listing of application ratings based on the determined battery consumption rating of the application under test.

9. The method of claim 8, further comprising at least one of downloading the application under test over the live communications network and using an application preinstalled on the test device as the application under test.

10. The method of claim 8, further comprising:
receiving test results for the application under test from a developer of the application under test;
receiving test results for the application under test from an owner of the application under test; and
determining the test results for the application under test by a service provider providing the listing of application ratings.

11. The method of claim 8, further comprising:
setting a configuration of the first test mobile device and a configuration of the second test mobile device according to at least one of an application profile associated with the application under test and configuration settings associated with a type of the first and second test mobile devices; and
performing simultaneous testing of the first test mobile device and the second test mobile device.

12. The method of claim 8, wherein the predetermined rating criteria include a first battery consumption rating associated with a first range of current usage indicative of a first level of battery life loss associated with execution of the application under test and a second battery consumption rating associated with a second range of current usage indicative of a second level of battery life loss associated with execution of the application under test, and further comprising at least one of:
assigning the first battery consumption rating to the application under test when the idle mode current draw associated with execution of the application under test is included within the first range of current usage, and
assigning the second battery consumption rating to the application under test when the idle mode current draw associated with execution of the application under test is included within the second range of current usage.

13. The method of claim 8, further comprising:
identifying the application under test as being higher priority for being tested according to criteria including at least one of: (i) the application under test being a most frequently downloaded application, (ii) the application under test being a most frequently used application, (iii) the application under test being a popular application for which a new version is available, (iv) the application under test being preloaded on the testing device and (v) a previous version of the application under test being included in the listing of application ratings; and
selectively including the application under test for testing in a listing of applications to be tested according to the identification of being higher priority.

14. A non-transitory computer readable medium storing a testing application, the testing application being executable by a processor to provide operations comprising:
identifying, by the processor, an idle mode current draw according to test results representative of measured current usage associated with execution of an application under test on a test mobile device in communication with a live communications network of a network service provider;
identifying first information indicative of current usage of a first test mobile device onto which the application under test is installed;
identifying second information indicative of current usage of a second test mobile device onto which the application under test is not installed;
determining, by the processor, the idle mode current draw associated with execution of the application under test according to the first and second information
determining, by the processor, a battery consumption rating associated with the application under test according to the idle mode current draw and predetermined rating criteria, thereby allowing for improved battery consumption; and
updating a listing of applications ratings based on the determined battery consumption rating of the application under test.

15. The non-transitory computer readable medium of claim 14, further providing for operations comprising sending a test notification including the application rating to at least one of an application developer of the application under test and an application owner of the application under test.

16. The non-transitory computer readable medium of claim 14, further providing for operations comprising:
identifying at least one type or category of the application under test; and
selecting the predetermined rating criteria based at least in part on the identification.

17. The non-transitory computer readable medium of claim 14, wherein the first information indicative of current usage of a first test mobile device and the second information indicative of current usage of a second test mobile device are determined accordingly to simultaneous testing of the first test mobile device and the second test mobile device.

18. The non-transitory computer readable medium of claim 14, further providing for operations comprising setting a configuration of the first test mobile device and a configuration of the second test mobile device according to at least one of an application profile associated with the application under test and configuration settings associated with a type of the first and second test mobile devices.

19. The non-transitory computer readable medium of claim 14, wherein the predetermined rating criteria include a first battery consumption rating associated with a first range of current usage indicative of a first level of battery life loss associated with execution of the application under test and a second battery consumption rating associated with a second range of current usage indicative of a second level of battery life loss associated with execution of the application under test, the non-transitory computer readable further providing for operations comprising:

assigning the first battery consumption rating to the application under test when the idle mode current draw associated with execution of the application under test is included within the first range of current usage, and assigning the second battery consumption rating to the application under test when the idle mode current draw associated with execution of the application under test is included within the second range of current usage.

20. The non-transitory computer readable medium of claim 14, further providing for operations comprising:

identifying the application under test as being higher priority for being tested according to criteria including at least one of: (i) the application under test being a most frequently downloaded application, (ii) the application under test being a most frequently used application, (iii) the application under test being a popular application for which a new version is available, (iv) the application under test being preloaded on the testing device and (v) a previous version of the application under test being included in the listing of application ratings; and selectively including the application under test for testing in a listing of applications to be tested according to the identification of being higher priority.

\* \* \* \* \*